US009143313B2

(12) United States Patent
Kitsunezuka

(10) Patent No.: US 9,143,313 B2
(45) Date of Patent: Sep. 22, 2015

(54) FREQUENCY SWEEP SIGNAL GENERATOR, FREQUENCY COMPONENT ANALYSIS APPARATUS, RADIO APPARATUS, AND FREQUENCY SWEEP SIGNAL GENERATING METHOD

(75) Inventor: Masaki Kitsunezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/239,525

(22) PCT Filed: Jun. 12, 2012

(86) PCT No.: PCT/JP2012/003817
§ 371 (c)(1),
(2), (4) Date: Feb. 18, 2014

(87) PCT Pub. No.: WO2013/027314
PCT Pub. Date: Feb. 28, 2013

(65) Prior Publication Data
US 2014/0185726 A1    Jul. 3, 2014

(30) Foreign Application Priority Data

Aug. 23, 2011   (JP) .................. 2011-181625

(51) Int. Cl.
*H03B 23/00*   (2006.01)
*H04L 7/033*   (2006.01)
(Continued)

(52) U.S. Cl.
CPC .............. *H04L 7/033* (2013.01); *H03B 5/1215* (2013.01); *H03B 5/1228* (2013.01);
(Continued)

(58) Field of Classification Search
CPC .. H03B 23/00; H03B 2200/0092; H03L 7/12; H03L 2207/05

USPC ............... 331/4, 145, 153, 172, 173, 178
See application file for complete search history.

(56) References Cited

U.S. PATENT DOCUMENTS 3,754,185 A * 8/1973 Troy ..................... 324/603
3,872,406 A * 3/1975 Grafinger ............... 331/178
(Continued)

FOREIGN PATENT DOCUMENTS

JP    54-3453 A        1/1979
JP    H05-157785 A     6/1993
(Continued)

OTHER PUBLICATIONS

International Search Report in PCT/JP2012/003817 dated Sep. 11, 2012 (English Translation Thereof).

*Primary Examiner* — Levi Gannon
(74) *Attorney, Agent, or Firm* — McGinn IP Law Group, PLLC

(57) ABSTRACT

A frequency sweep signal generator in which the frequency error is small even when the control values and the oscillating frequencies have a non-linear relation. The frequency sweep signal generator includes a variable frequency oscillator that changes an oscillating frequency according to a change of an input control value, and a first controller that generates a first control value so that the oscillating frequency within a predetermined frequency sweeping range is output. The first controller controls an increment of the first control value to be output to the variable frequency oscillator per unit time so that, when a change of the oscillating frequency with respect to the increment of the first control value is non-linear, the oscillating frequency is changed linearly with respect to a passage of time.

13 Claims, 12 Drawing Sheets

(51) Int. Cl.
*H03B 5/12* (2006.01)
*H03J 1/00* (2006.01)
*H03L 7/089* (2006.01)

(52) U.S. Cl.
CPC ............. *H03B 5/1243* (2013.01); *H03B 23/00* (2013.01); *H03J 1/0091* (2013.01); *H03B 2200/0092* (2013.01); *H03J 2200/10* (2013.01); *H03L 7/0893* (2013.01); *H03L 2207/05* (2013.01)

(56) References Cited

U.S. PATENT DOCUMENTS

| | | | | |
|---|---|---|---|---|
| 3,978,411 A | * | 8/1976 | Sakamoto | 455/167.1 |
| 4,129,832 A | * | 12/1978 | Neal et al. | 331/44 |
| 4,130,808 A | | 12/1978 | Marzalek | |
| 4,342,007 A | * | 7/1982 | Elliott | 331/4 |
| 4,417,218 A | * | 11/1983 | Berke | 331/178 |
| 4,468,638 A | * | 8/1984 | Kyriakos | 331/178 |
| 4,499,435 A | * | 2/1985 | Thomson et al. | 331/44 |
| 4,593,287 A | * | 6/1986 | Nitardy | 342/200 |
| 4,754,277 A | * | 6/1988 | Voyce | 342/83 |
| 4,998,217 A | * | 3/1991 | Holcomb et al. | 702/86 |
| 5,016,202 A | * | 5/1991 | Seibel et al. | 702/106 |
| 5,379,001 A | * | 1/1995 | Hedtke | 331/4 |

FOREIGN PATENT DOCUMENTS

| | | |
|---|---|---|
| JP | H11-160417 A | 6/1999 |
| JP | 2001-059852 A | 3/2001 |
| JP | 2005-150856 A | 6/2005 |
| JP | 2007-298317 A | 11/2007 |
| JP | 2008-193396 A | 8/2008 |

* cited by examiner

FREQUENCY SWEEP SIGNAL GENERATOR, FREQUENCY COMPONENT ANALYSIS APPARATUS, RADIO APPARATUS, AND FREQUENCY SWEEP SIGNAL GENERATING METHOD

TECHNICAL FIELD

The present invention relates to a frequency sweep signal generator capable of performing frequency sweeping at a high speed.

BACKGROUND ART

In recent years, the cognitive radio technique has been attracting attention in order to effectively use stringent radio frequency bands. Examples of typical cognitive radio standards include IEEE 802.22. The cognitive radio technique according to the IEEE 802.22 searches for an available frequency band (white space) from among the frequency bands for television, which extend from 54 MHz to 862 MHz, and uses the available frequency band for a secondary purpose. The implementation of the cognitive radio technique requires a frequency component analysis apparatus for searching for a white space from among a wide range of frequency bands.

If the frequency component analysis apparatus can find a white space at a high speed, the radio apparatus can be used for a longer time, which is longer because the white space can be found in a shorter time, for data communication. Further, if the frequency component analysis apparatus can immediately detect the presence of a radio system(s) having a priority (a television set in the above-described example), the radio apparatus can prevent any interference with the system having a priority by using the cognitive radio system. Therefore, it is desired that the frequency component analysis apparatus, which searches for a white space, has a high-speed characteristic.

Patent literature 1 discloses a frequency component analysis apparatus including a local oscillator using a phase-locked loop, a mixer for performing a frequency conversion by multiplying a signal to be analyzed by a local oscillation signal, a filter for removing a unnecessary frequency component, and an intensity detector for detecting the intensity of a signal contained in a necessary frequency band. The frequency component analysis apparatus like this sweeps local oscillating frequencies in a range of a necessary frequency band and thereby can analyze a radio-wave intensity distribution in the swept frequency band by using a frequency resolution determined by the band width of the filter.

However, it is very difficult to increase the processing speed for the frequency component analysis by using the simple configuration like this. That is, in the method in which local oscillating frequencies are swept in a predetermined frequency range while locking the frequency with a predetermined resolution in a stepwise manner, the sweeping speed depends on the lock time that is determined by the time constant of the phase-locked loop. Specifically, while the convergence time of the filter used for extracting only the signal band of the digital television broadcast, whose signal band width is 8 Mhz, and the convergence time of the intensity detector for the frequency component that has passed through the filter are no greater than 10 microseconds, the lock time for one frequency is about 50 microseconds to 100 microseconds.

Further, in measurement apparatuses for frequency component analysis, in general, a ramp signal is added to the control value of a variable frequency oscillator while locking a local oscillating frequency at the center of a predetermined frequency range. The method for sweeping frequencies like this has an excellent high-speed characteristic. However, this method requires a circuit for generating a ramp signal in addition to the phase-locked loop. In general, an operational amplifier is used for the ramp signal generation circuit. Therefore, there are problems that the power consumption is large and a number of capacitive elements are used, requiring a large area. Further, there is another problem that when the relation between control values and local oscillating frequencies is not linear, a large frequency error occurs.

Therefore, Patent literature 2 and 3 disclose configurations in which a frequency oscillator receives digital data, generates a frequency according to the digital data, and outputs the generated frequency. The digital data and the frequency to be generated are associated with each other in advance. This configuration eliminates the need for outputting a signal or the like to the frequency oscillator by using the phase-locked loop.

CITATION LIST

Patent Literature

Patent literature 1: Japanese Unexamined Patent Application Publication No. S54-003453
Patent literature 2: Japanese Unexamined Patent Application Publication No. 2008-193396
Patent literature 3: Japanese Unexamined Patent Application Publication No. H05-157785

SUMMARY OF INVENTION

Technical Problem

However, Patent literature 2 discloses only operations of the frequency oscillator in the case where the digital data and the oscillating frequencies have a linear relation. Therefore, there is a problem that when the digital data and the oscillating frequencies have a non-linear relation, a large frequency error occurs. Further, Patent literature 3 also discloses operations of the frequency oscillator in the case where the oscillating frequency increases linearly with the elapse of time. However, Patent literature 3 does not at all disclose how the oscillating frequency and the elapsed time have a linear relation in the case where the digital data and the oscillating frequency have a non-linear relation. Therefore, similarly to Patent literature 2, Patent literature 3 has a problem that when the digital data and the oscillating frequency have a non-linear relation, a large frequency error occurs.

In order to solve the above-described problems, an object of the present invention is to provide a frequency sweep signal generator, a frequency component analysis apparatus, a radio apparatus, and a frequency sweep signal generating method, capable of reducing the frequency error even when the control values and the oscillating frequencies have a non-linear relation.

Solution to Problem

A frequency sweep signal generator according to a first aspect of the present invention includes: a variable frequency oscillator that changes an oscillating frequency according to a change of an input control value; and a first controller that generates a first control value so that the oscillating frequency within a predetermined frequency sweeping range is output; in which the first controller controls an increment of the first control value to be output to the variable frequency oscillator per unit time so that, when a change of the oscillating frequency with respect to the increment of the first control value is non-linear, the oscillating frequency is changed linearly with respect to a passage of time.

A frequency component analysis apparatus according to a second aspect of the present invention includes: a variable frequency oscillator that changes an oscillating frequency according to a change of an input control value; and a first controller that generates a first control value so that the oscillating frequency within a predetermined frequency sweeping range is output; in which the first controller includes: a frequency sweep signal generator that controls an increment of the first control value to be output to the variable frequency oscillator per unit time so that, when a change of the oscillating frequency with respect to the increment of the first control value is non-linear, the oscillating frequency is changed linearly with respect to a passage of time; a mixer that mixes a signal generated in the frequency sweep signal generator with a signal to be analyzed and extracts a signal having a desired frequency, the signal to be analyzed being a subject to be analyzed; and an intensity detector that detects an intensity of the signal extracted by the mixer.

A radio apparatus according to a third aspect of the present invention includes: a variable frequency oscillator that changes an oscillating frequency according to a change of an input control value; and a first controller that generates a first control value so that the oscillating frequency within a predetermined frequency sweeping range is output; in which the first controller includes: a frequency sweep signal generator that controls an increment of the first control value to be output to the variable frequency oscillator per unit time so that, when a change of the oscillating frequency with respect to the increment of the first control value is non-linear, the oscillating frequency is changed linearly with respect to a passage of time; a mixer that mixes a signal generated in the frequency sweep signal generator with a signal to be analyzed and extracts a signal having a desired frequency, the signal to be analyzed being a subject to be analyzed; an intensity detector that detects an intensity of the signal extracted by the mixer; and a demodulator that demodulates a signal transmitted by using an available frequency band detected by using the intensity detector.

A frequency sweep signal generating method according to a fourth aspect of the present invention is a frequency sweep signal generating method in a variable frequency oscillator that changes an oscillating frequency according to a change of an input control value, the frequency sweep signal generating method including controlling, when the control value is generated so that the oscillating frequency within a predetermined frequency sweeping range is output, an increment of the control value to be output to the variable frequency oscillator per unit time so that, when a change of the oscillating frequency with respect to the increment of the control value is non-linear, the oscillating frequency is changed linearly with respect to a passage of time.

Advantageous Effects of Invention

According to the present invention, it is possible to provide a frequency sweep signal generator, a frequency component analysis apparatus, a radio apparatus, and a frequency sweep signal generating method, capable of reducing the frequency error even when the control values and the oscillating frequencies have a non-linear relation.

DESCRIPTION OF EMBODIMENTS

First Exemplary Embodiment

Exemplary embodiments according to the present invention are explained hereinafter with reference to the drawings. Note that the same symbols are assigned to the same elements throughout all the drawings explained below, and explanation is omitted as necessary. Firstly, a configuration example of a frequency sweep signal generator according to a first exemplary embodiment of the present invention is explained with reference to FIG. 1. The frequency sweep signal generator includes a variable frequency oscillator 0101 and a first controller 0102.

The variable frequency oscillator 0101 changes an oscillating frequency according to the change of an input control value. For example, a voltage value may be used as the control value. In this case, the variable frequency oscillator 0101 generates an oscillating frequency corresponding to an input voltage value. Further, the voltage value may be analog data or digital data that is obtained by converting analog data into discrete data. Alternatively, predetermined values corresponding to oscillating frequencies may be used as the control values.

The first controller 0102 generates a first control value X so that an oscillating frequency within a predetermined frequency sweeping range is output. The frequency sweeping range is a range of frequencies that are analyzed by a radio communication apparatus or the like in order to detect a white space. The first control value is similar to the aforementioned control value, and a control value output from the first controller 0102 is used as the first control value X.

Further, when the oscillating frequency changes non-linearly with respect to the increment of the first control value X, the first controller 0102 controls the increment of the first control value X to be output to the variable frequency oscillator per unit time so that the oscillating frequency is changed linearly with respect to the passage of time.

Figure 2A:
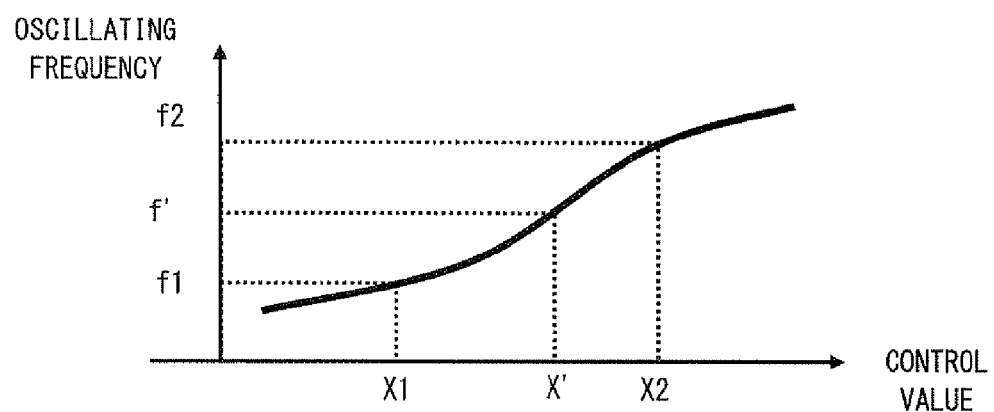
FIG. 2A is a graph showing a relation between control values and oscillating frequencies according to the first exemplary embodiment.

A relation between first control values and oscillating frequencies and a relation between elapsed time and oscillating frequencies are explained hereinafter with reference to FIGS. 2A and 2B. In FIG. 2A, the symbols f1 and f2 represent the lower limit and upper limit, respectively, of the frequencies to be swept. The symbol f' represents a value between the values f1 and f2. Further, when the first control value is X1, the oscillating frequency is f1. When the first control value is X2, the oscillating frequency is f2. Further, when the first control value is X', the oscillating frequency is f'.

Changes of the oscillating frequency with respect to changes of the first control value in FIG. 2A are explained hereinafter. When the vicinity of the first control value X1, the vicinity of the first control value X', and the vicinity of the first control value X2 are compared, it is seen that the increment of the oscillating frequency in the vicinity of the first control value X' is larger than the increments of the oscillating frequency in the vicinities of the first control values X1 and X2. That is, in the relation between the first control values and the oscillating frequencies, the increment of the oscillating frequency is not constant between the first control values X1 and X2. That is, the oscillating frequency changes non-linearly between the first control values X1 and X2.

Figure 2B:
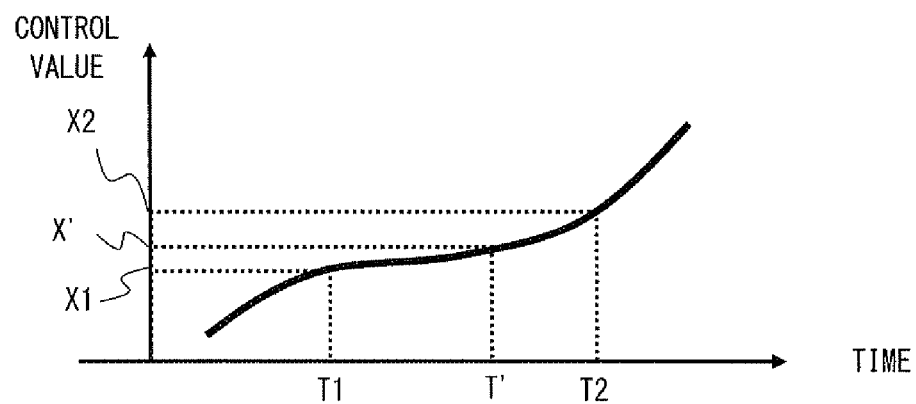
FIG. 2B is a graph showing a relation between elapsed time and control values according to the first exemplary embodiment.

Further, the first controller 0102 changes the first control value X between the times T1 and T2 as shown in FIG. 2B. Specifically, the first controller 0102 outputs the first control value X1 to the variable frequency oscillator 0101 at the time T1 and outputs the first control value X2 to the variable frequency oscillator 0101 at the time T2. Further, the first controller 0102 outputs the first control value X' to the variable frequency oscillator 0101 at the time T'. Changes of the first control value with respect to changes of the time in FIG. 2B are explained hereinafter. When the vicinity of the time T1, the vicinity of the time T2, and the vicinity of the time T' are compared, it is seen that the increment of the first control value in the vicinity of the time T' is smaller than the increments of the first control value in the vicinities of the times T1 and T2.

Even when the first control values and the oscillating frequencies have a non-linear relation as shown in FIG. 2A, the first controller 0102 can obtain oscillating frequencies that change linearly with respect to the elapsed time by controlling the increment of the first control value to be output per unit time and thereby determining a schedule according to which the first control value is changed. By obtaining the oscillating frequencies that change linearly with respect to the elapsed time in this manner, the frequency errors can be reduced.

Figure 1:
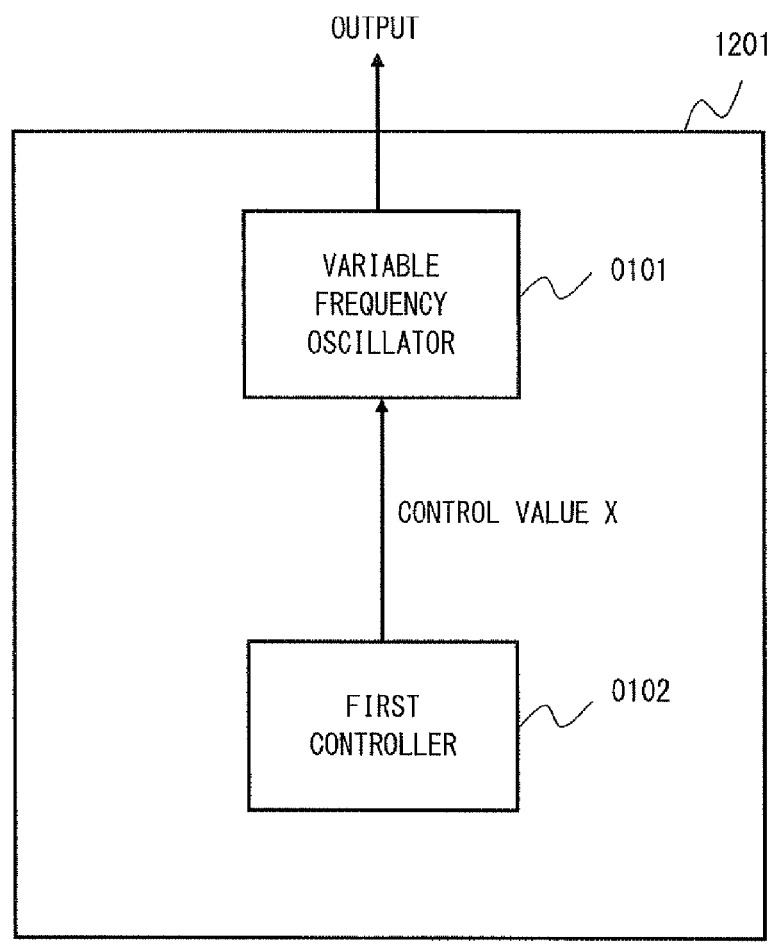
FIG. 1 is a configuration diagram of a frequency sweep signal generator according to a first exemplary embodiment.

Further, the frequency sweep signal generator in FIG. 1 does not require any phase-locked loop to sweep the first control value X. This is because the first controller 0102 determines the first control value X to be output to the variable frequency oscillator 0101 by using relations shown in FIGS. 2A and 2B. Therefore, the frequency sweep signal generator in FIG. 1 does not require any processing time necessary for the phase lock, and thus can perform frequency sweeping at a higher speed in comparison to the case where the phase-locked loop is used.

Further, although the first control value X is changed non-linearly with respect to the elapsed time as shown in FIG. 2B, the rate at which the first control value X changes is low, i.e., in the order of several MHz when expressed as a frequency. Therefore, the first controller 0102 can generate the first control value X while being able to have a smaller size and achieving lower power consumption, by using a digital signal processing circuit. Further, the first controller 0102 can also be implemented by using an analog signal processing circuit. However, when the circuit size, the tolerance to variations, and the like need to be taken into consideration, the use of a digital signal processing circuit is preferable.

Figure 3:
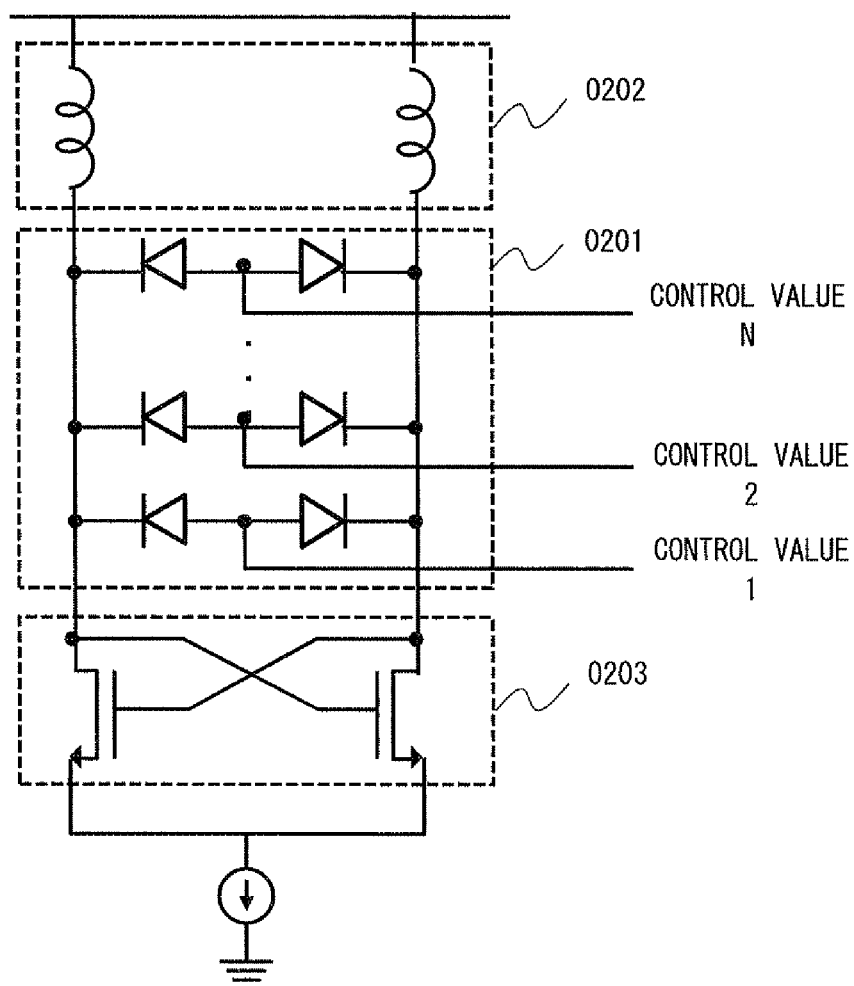
FIG. 3 is a configuration diagram of a variable frequency oscillator according to the first exemplary embodiment.

Next, a configuration example of the variable frequency oscillator 0101 according to the first exemplary embodiment is explained with reference to FIG. 3. The variable frequency oscillator 0101 shown in FIG. 3 is controlled by using control values (digital signal). The variable frequency oscillator 0101, which is controlled by using the digital signal, includes a varactor section 0201, a coil section 0202, and a transistor section 203. The variable frequency oscillator 0101 determines an oscillating frequency based on an inductance L in the coil section 0202 and a capacitance C in the varactor section 0201, and outputs the determined oscillating frequency. In the varactor section 0201, a number of small varactors (capacitors) are connected in parallel. Each varactor may be controlled by using binary values consisting of a high level and a low level. That is, the varactor section 0201 receives either a high-level signal or a low-level signal for each of the control values 1 to N and thereby changes the capacitance to be generated. Further, in the case where each varactor is controlled in an analog fashion, that is, in the case where each of the control values 1 to N takes on an analog value, a digital/analog convertor(s) for converting a digital control value X into an analog value may be used. In this way, it is possible to use an analog-controlled voltage control oscillator as the variable frequency oscillator 0101.

Figure 4:
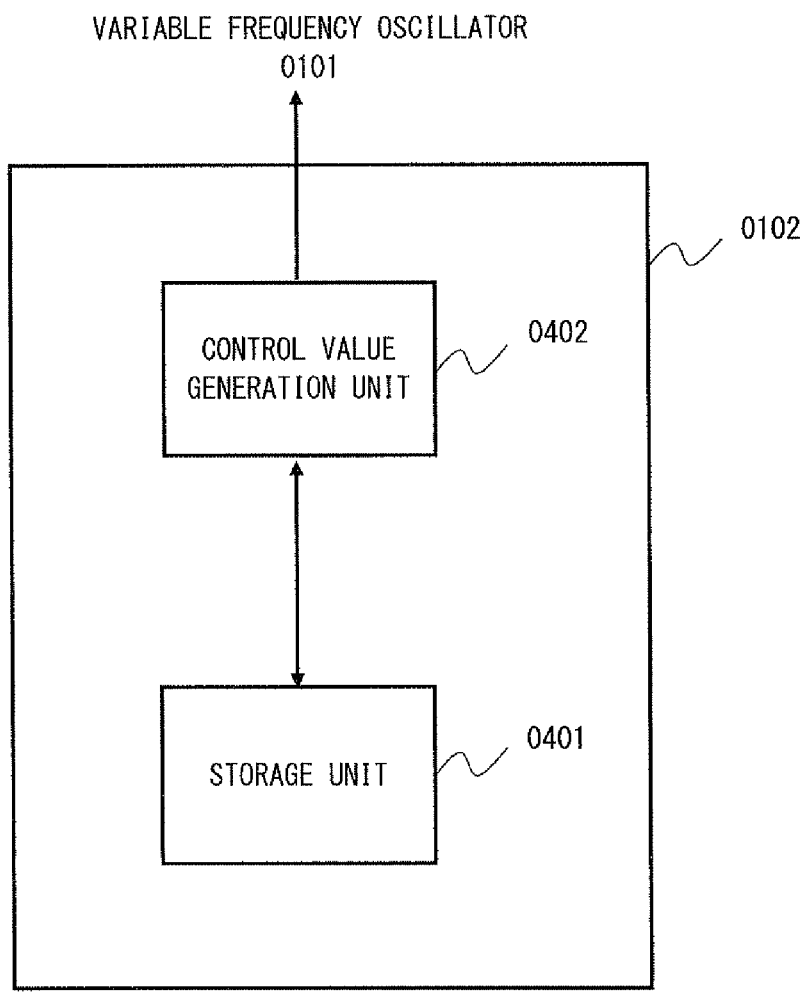
FIG. 4 is a configuration diagram of a first controller according to the first exemplary embodiment.

Next, a configuration example of the first controller 0102 according to the first exemplary embodiment is explained with reference to FIG. 4. The first controller 0102 includes a storage unit 0401 and a control value generation unit 0402, The storage unit 0401 stores information about the relation between first control values and oscillating frequencies shown in FIG. 2A and the relation between times and first control values X to be output at those times shown in FIG. 2B.

The control value generation unit 0402 generates a first control value according to an output schedule for the first control value X stored in the storage unit 0401, and outputs the generated first control value to the variable frequency oscillator 0101. In this manner, the control value generation unit 0402 can read information stored in the storage unit 0401.

Further, information may be written into the storage unit 0401 by using a control unit such as a CPU (not shown) included in the first controller 0102. In this manner, new information is written into the storage unit 0401, or information stored in the storage unit 0401 is edited and so on. Therefore, even when the frequency range to be swept is changed and/or the characteristics of the variable frequency oscillator are changed depending on the operating conditions, the output schedule for the first control value can be changed in a flexible manner.

As explained above, by using the frequency sweep signal generator according to the first exemplary embodiment of the present invention, it is possible, even when the control values and the oscillating frequencies have a non-linear relation, to output oscillating frequencies that change linearly with respect to the elapsed time by adjusting the schedule according to which the control values are output.

Second Exemplary Embodiment

Figure 5:
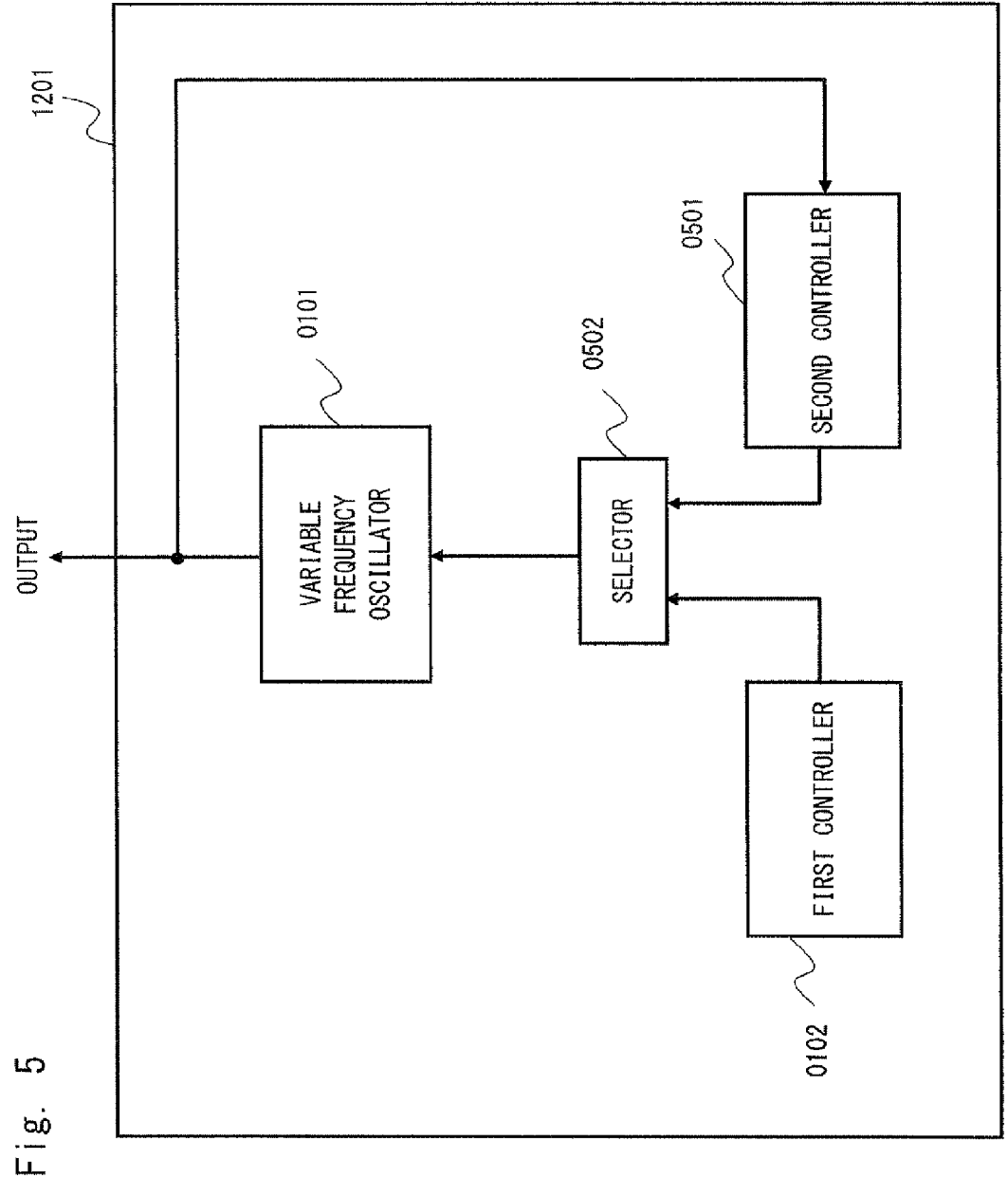
FIG. 5 is a configuration diagram of a frequency sweep signal generator according to a second exemplary embodiment.

Next, a configuration example of a frequency sweep signal generator according to a second exemplary embodiment of the present invention is explained with reference to FIG. 5. The frequency sweep signal generator according to the second exemplary embodiment includes a variable frequency oscillator 0101, a first controller 0102, a second controller 0501, and a selector 0502.

The second controller 0501 outputs a value corresponding to a difference between the frequency or the phase of the output signal of the variable frequency oscillator 0101 and the frequency or the phase of a reference signal, to the selector 0502 as a second control value. In this manner, the second controller 0501 serves as one of the components forming the phase-locked loop, and can determine the relation between the oscillating frequency output from the variable frequency oscillator 0101 and the second control value with high accuracy.

The selector 0502 receives the first control value from the first controller 0102 and receives the second control value from the second controller 0501. The selector 0502 selects one of the first and second control values and outputs the selected control value to the variable frequency oscillator 0101. For example, when frequency sweeping is performed at a high speed by using the first controller 0102, the selector 0502 changes the switch to the first controller 0102 side. As a result, the selector 0502 stops the operation of the second controller 0501, and thereby can reduce the power consumption by an amount necessary for the operation of the second controller 0501. Further, when control values are associated with oscillating frequencies (or local oscillating frequencies) output from the variable frequency oscillator 0101 with high accuracy by using the second controller 0501, the selector 0502 changes the switch to the second controller 0501 side. As a result, the selector 0502 stops the operation of the first controller 0102, and thereby can reduce the power consumption by an amount necessary for the operation of the first controller 0102.

Further, a relation between oscillating frequencies determined by using the second controller 0501 and second control values may be generated in advance by changing the switch of the selector 0502 to the second controller 0501, and the generated information may be stored into the storage unit 0401 of the first controller 0102. Next, the selector 0502 changes the switch to the first controller 0102 and thereby performs frequency sweeping at a high speed by using the first controller 0102. By doing so, the first controller 0102 can output the first control value X by using the relation between the control values and the oscillating frequencies that have been determined with high accuracy by using the phase-locked loop. Therefore, the accuracy of the oscillating frequency output from the variable frequency oscillator 0101 can be improved.

Figure 6:
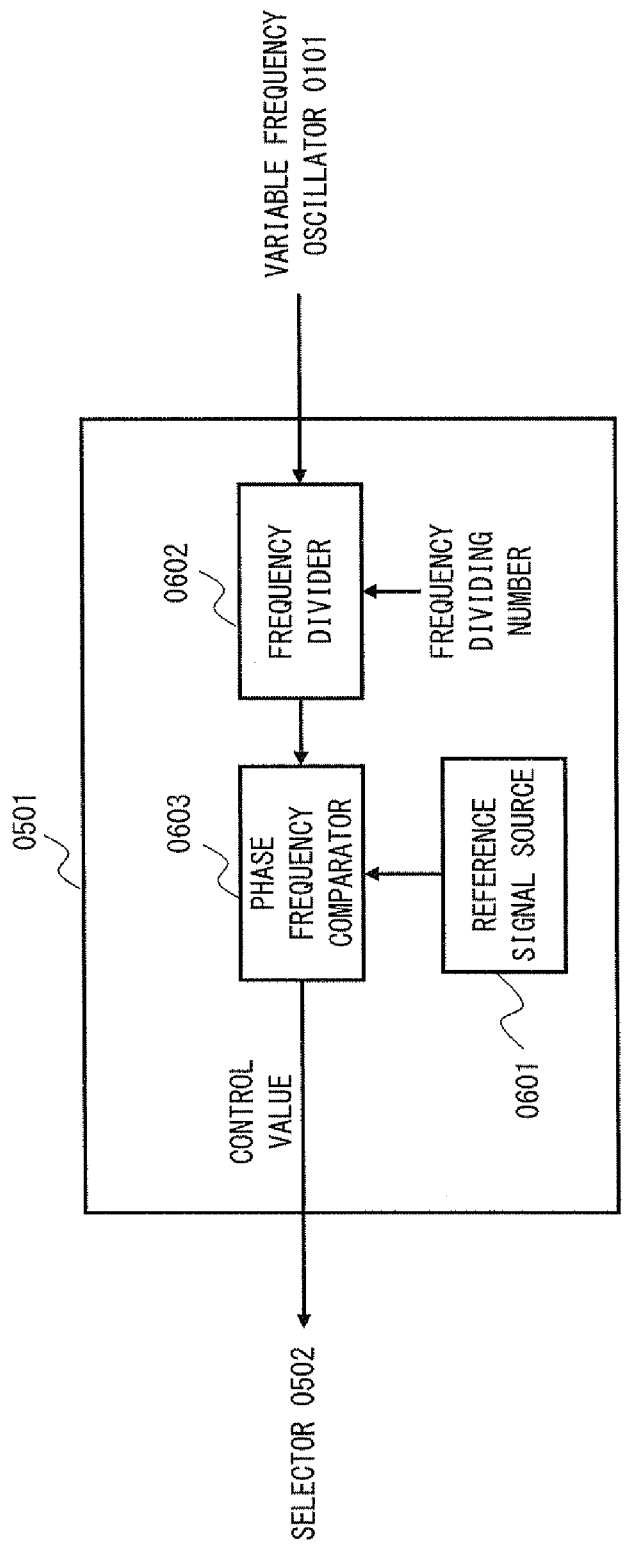
FIG. 6 is a configuration diagram of a second controller according to the second exemplary embodiment.

Next, a configuration example of the second controller 0501 according to the second exemplary embodiment of the present invention is explained with reference to FIG. 6. The second controller 0501 includes a reference signal source 0601, a frequency divider 0602, and a phase frequency comparator 0603.

The frequency divider 0602 divides the frequency of an oscillating frequency signal output from the variable frequency oscillator 0101, and outputs the resultant signal to the phase frequency comparator 0603. The second controller 0501 can change the frequency dividing number in the frequency divider 0602.

The phase frequency comparator 0603 outputs a difference between the frequency or the phase of a reference signal output from the reference signal source 0601 and the frequency or the phase of the frequency-divided signal output from the frequency divider 0602, to the selector 0502 as a second control value. In this manner, the reference signal source 0601, the frequency divider 0602, and the phase frequency comparator 0603 form a phase-locked loop.

Further, the second controller 0501 can change the local oscillating frequency by changing the frequency dividing number of the frequency divider 0602. Specifically, a negative feedback is formed so that a relation "fVCO=M*fREF" is satisfied where: fVCO represents the local oscillating frequency; fREF represents the reference signal frequency; and M represents the frequency dividing number. By this negative feedback, it is possible to determine the control values X1 and X2 at the times when the local oscillating frequency fVCO becomes f1 and f2, for example, with high accuracy. The relation between the control values X and the oscillating frequencies, which is determined with high accuracy, is stored in the storage unit 0401 of the first controller 0102 and used when frequency sweeping is performed.

Figure 7:
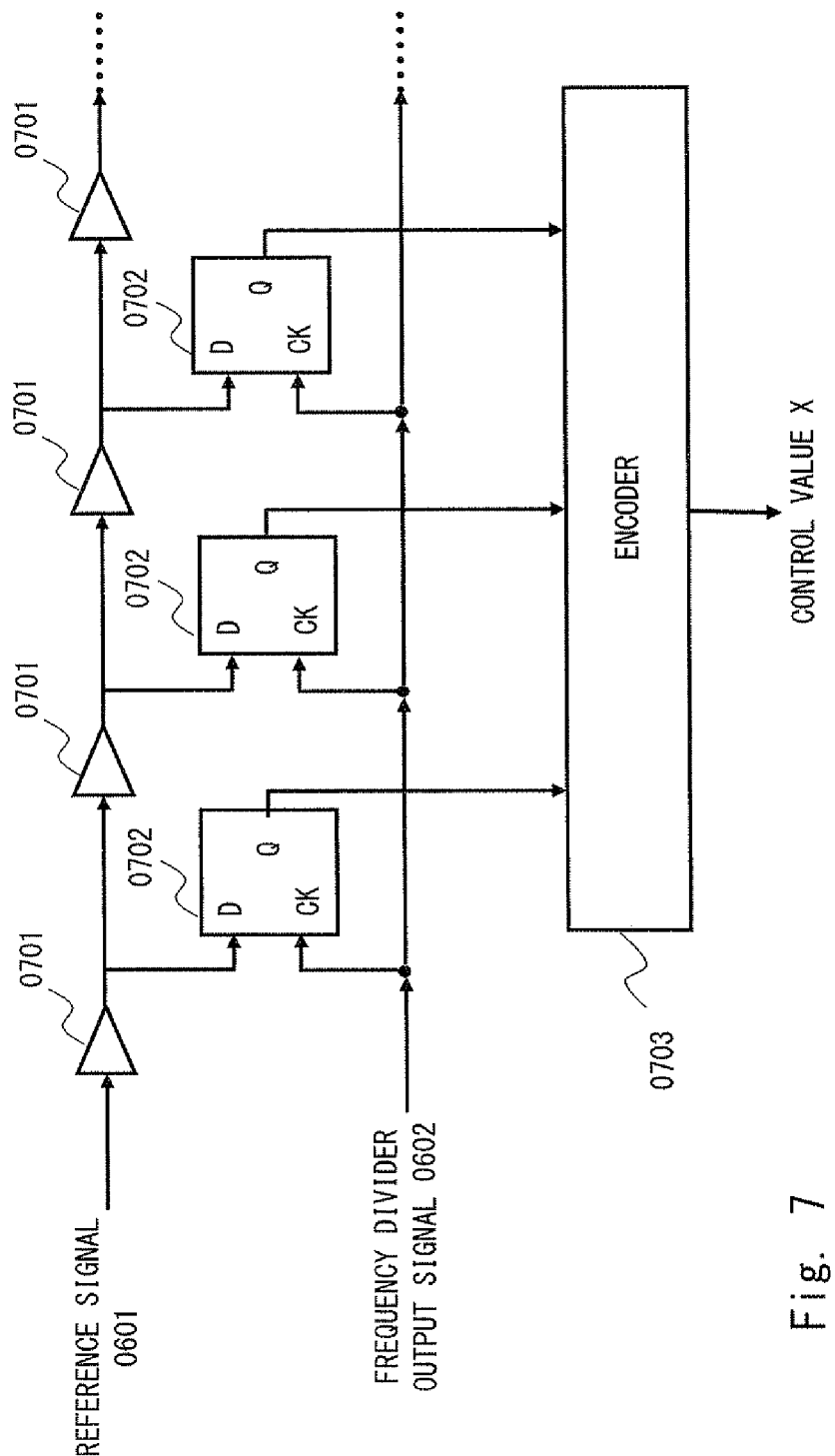
FIG. 7 is a configuration diagram of a phase frequency comparator according to the second exemplary embodiment.

Next, a configuration example of the phase frequency comparator 0603 according to the second exemplary embodiment of the present invention is explained with reference to FIG. 7. The phase frequency comparator 0603 includes a plurality of delay stages 0701, a plurality of delay-type flip-flops (DFFs) 0702, and an encoder 0703. The reference signal output from the reference signal source 0601 is input to the delay stage 0701. After a delay is added, the delayed signal is output to the DFF 0702 and the next delay stage 0701. Delays are added to the reference signal in the plurality of delay stages 0701. Then, the delayed signals are output from the delay stages 0701 to the respective DFFs 0702. The reference signal is input to a data terminal of the DFF 0702. Further, a frequency-divider output signal output from the frequency divider 0602 is input to a clock terminal of the DFF 0702. Each DFF 0702 outputs, from its Q-terminal, a value that is determined based on the time corresponding to the phase difference between the reference signal and the frequency-divider output signal.

The encoder 0703 encodes signals output from the respective DFFs 0702 and outputs the encoded signal to the variable frequency oscillator 0101 in the form of a digital value. The digital value output from the encoder 0703 is used as the second control value. Further, the circuit(s) forming the phase frequency comparator 0603 is also referred to as a time-to-digital convertor (TDC). Note that it is preferable to provide a digital filter for suppressing unnecessary spurious signals behind the TDC.

As explained above, by using the frequency sweep signal generator according to the second exemplary embodiment of the present invention, it is possible to determine the control value X corresponding to the local oscillating frequency fVCO with high accuracy by using the phase-locked loop. Further, by performing frequency sweeping in the first controller 0102, which does not use any phase-locked loop, by using the relation between control values X and local oscillating frequencies fVCO determined in the second controller 0501, it is possible to perform the frequency sweeping at a high speed.

Third Exemplary Embodiment

Figure 8:
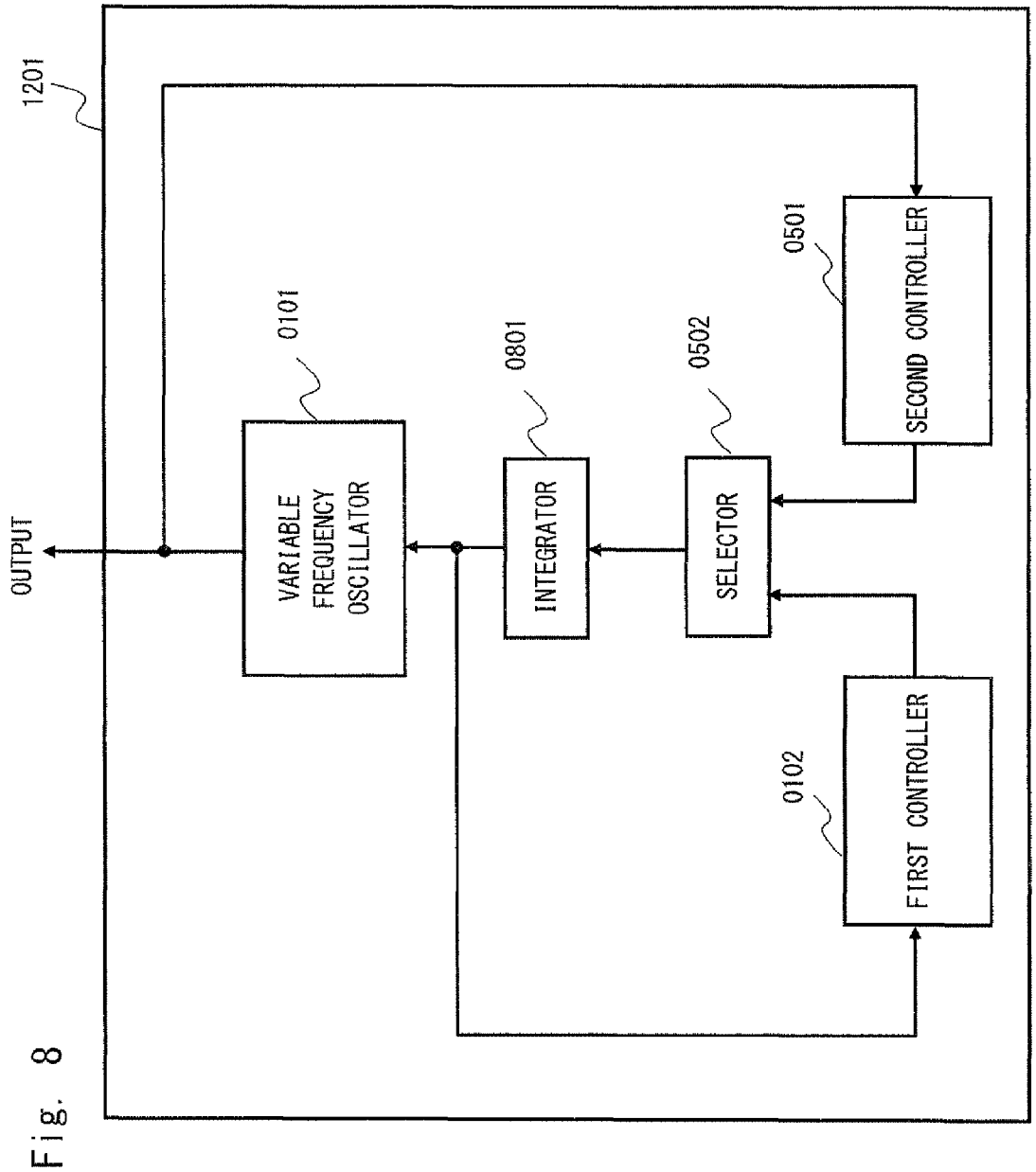
FIG. 8 is a configuration diagram of a frequency sweep signal generator according to a third exemplary embodiment.

Next, a configuration example of a frequency sweep signal generator according to a third exemplary embodiment of the present invention is explained with reference to FIG. 8. The frequency sweep signal generator according to the third exemplary embodiment includes a variable frequency oscillator 0101, a first controller 0102, a second controller 0501, a selector 0502, and an integrator 0801.

When frequency sweeping is performed at a high speed by using the first controller 0102, the integrator 0801 increases the control value from the initial value X for the control value output from the first controller 0102 at a fixed rate and outputs the gradually-increasing control value to the variable frequency oscillator 0101. The integrator 0801 stops increasing the control value when the control value reaches the control value indicating the final value for the frequency sweeping range. In this manner, upon receiving the control value, which is the initial value for the predetermined frequency sweeping range, the integrator 0801 can generate the control value in such a manner that the control value increases at a fixed rate and output the generated control value to the variable frequency oscillator 0101.

Further, when the second controller 0501 is used, the integrator 0801 is used as a loop filter for the purpose of stabilizing the feedback loop and suppressing unnecessary spurious signals. The integrator 0801 is used for both the first controller 0102 and the second controller 0501.

Note that when the relation between control values and oscillating frequencies can be considered to be linear in a range between the control values X1 to X2, the following operation can be performed. The integrator 0801 uses the value X1 as the initial value for the control value and increases the control value up to the value X2 at a fixed rate. In this manner, the storage unit 0401 of the first controller 0102 needs to store only the information about the control values X1 and X2 and outputs them to the integrator 0801. As a result, its necessary storage capacity can be significantly reduced.

When the relation between control values and oscillating frequencies is not linear in the range between the control values X1 to X2, the storage unit 0401 stores control values X at at least two points and oscillating frequencies corresponding to the control values X. In this manner, the range between the control values X1 to X2 is divided into at least two sections. The integrator 0801 adjusts the time constant for each of the divided sections and increases the control value from the initial control value for that section at a fixed rate. The time constant is set, for example, by adjusting the current amount of a charge pump 1001 and/or the capacitance value of a smoothing filter 1002 (which are explained later). The charge pump 1001 and the smoothing filter 1002 form the integrator 0801. As described above, by adjusting the time constant and increasing the control value for each of a plurality of divided sections, it is possible to change the control value X non-linearly with respect to the time change. As a result, it is possible to obtain a signal whose frequency changes linearly with respect to the elapsed time.

Figure 9:
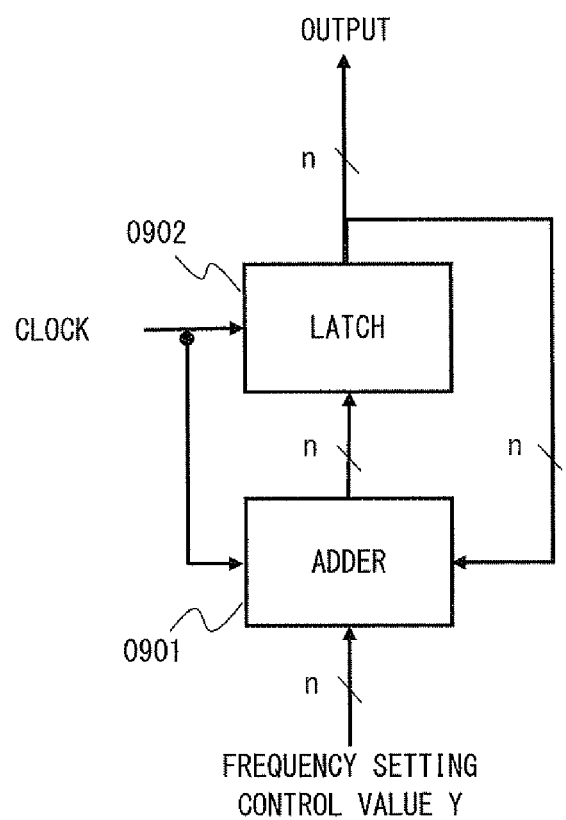
FIG. 9 is a configuration diagram of an integrator according to the third exemplary embodiment.

Next, a configuration example of the integrator 0801 according to a third exemplary embodiment of the present invention is explained with reference to FIG. 9. The integrator 0801 includes an adder 0901 and a latch 0902. Further, the integrator 0801 functions as an n-bit accumulator including an adder 0901 and a latch 0902. For example, an integration operation of the integrator 0801 is performed by supplying a clock frequency in the order of several MHz to the latch 0902. The power consumption of the integrator 0801, which operates at several MHz, is sufficiently low. Further, the time constant of the integrator 0801 can be changed by using the frequency or a frequency setting control value Y of the operation clock. For example, when the value Y is one, the integrator generates an output that increases by one for each clock. Further, when the value Y is two, the integrator generates an output that increases by two for each clock. In this state, the time constant of the integrator is halved in comparison to when the value Y is one. That is, the time constant of the integrator can be changed by the value Y.

Figure 10:
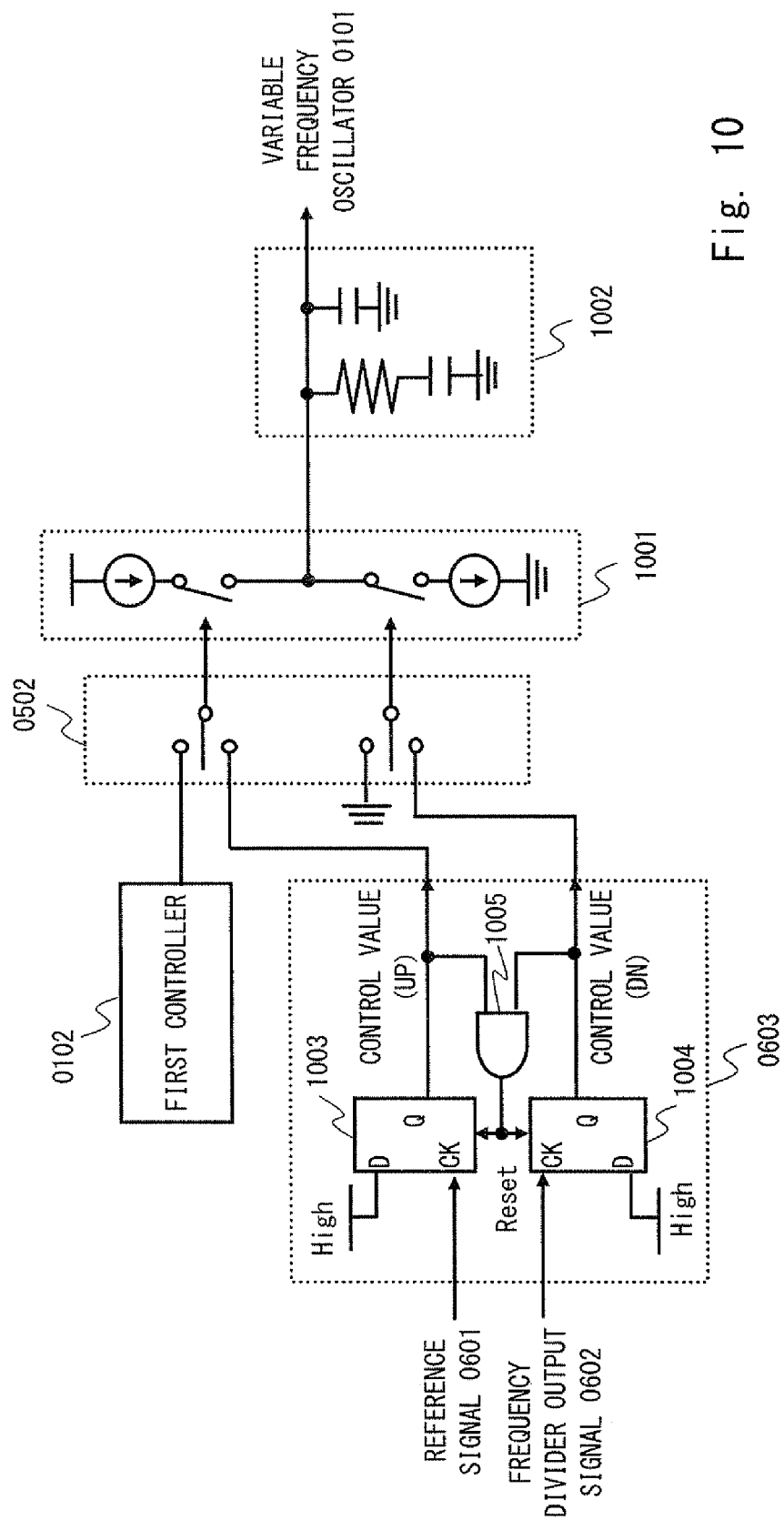
FIG. 10 is a configuration diagram of an integrator according to the third exemplary embodiment in which control values are analog values.

Next, a circuit example of the integrator 0801 in the case where the control value X is an analog value is explained with reference to FIG. 10. Note that FIG. 10 also shows a circuit example of the phase frequency comparator 0603 when it is implemented in an analog fashion.

The analog phase frequency comparator 0603 includes DFFs 1003 and 1004, and an AND gate 1005. The DFF 1003 receives a reference signal through its clock terminal, and its data terminal is fixed at a high level. Further, the DFF 1004 receives a frequency-divider output signal through its clock terminal, and its data terminal is fixed at a high level.

The AND gate 1005 calculates the logical multiplication of the outputs values of the DFFs 1003 and 1004 and outputs the result of the logical multiplication to the reset terminals of the DFFs 1003 and 1004. The phase frequency comparator 0603 outputs two control values, i.e., a control value UP that becomes a high level when the phase or the frequency of the reference signal is fast and a control value DN that becomes a high level when the phase or the frequency of the frequency-divider output signal is fast. These control values are input through the selector 502 to the integrator 0801, which is formed by the charge pump 1001 and the smoothing filter 1002.

In the charge pump 1001, switch elements are connected in series between a current source connected to the power-supply voltage and a current source connected to the ground voltage. Note that the following explanation is given on the assumption that the state of each switch element becomes a conductive state when its control value is at a high level. When the state of the switch element connected to the current source connected to the power-supply voltage becomes a connected state, the voltage output to the smoothing filter 1002 and the variable frequency oscillator 0101 increases. The switch element connected to the current source connected to the power-supply voltage is controlled by either the first controller or the control value UP, i.e., the output of the DFF 1003. Further, when the state of the switch element connected to the current source connected to the ground voltage becomes a connected state, the voltage output to the smoothing filter 1002 and the variable frequency oscillator 0101 decreases. The switch element connected to the current source connected to the ground voltage is controlled by the control value DN, i.e., the output of the DFF 1004. Further, the smoothing filter 1002 is formed by a resistor and a capacitive element connected in series, and another capacitive element. The end points of the series-connected resistor and capacitive element and the other capacitive element are connected to the ground.

The integrator 0801 is used for both the first and second controllers. As a result, the circuit size is smaller in comparison to the frequency sweep signal generator in which both the phase-locked loop and the ramp waveform generation circuit are indispensable. The time constant of the integrator 0801 can be changed by adjusting the current amount of the charge pump 1001 and/or the capacitance value of the smoothing filter 1002.

Figure 11:
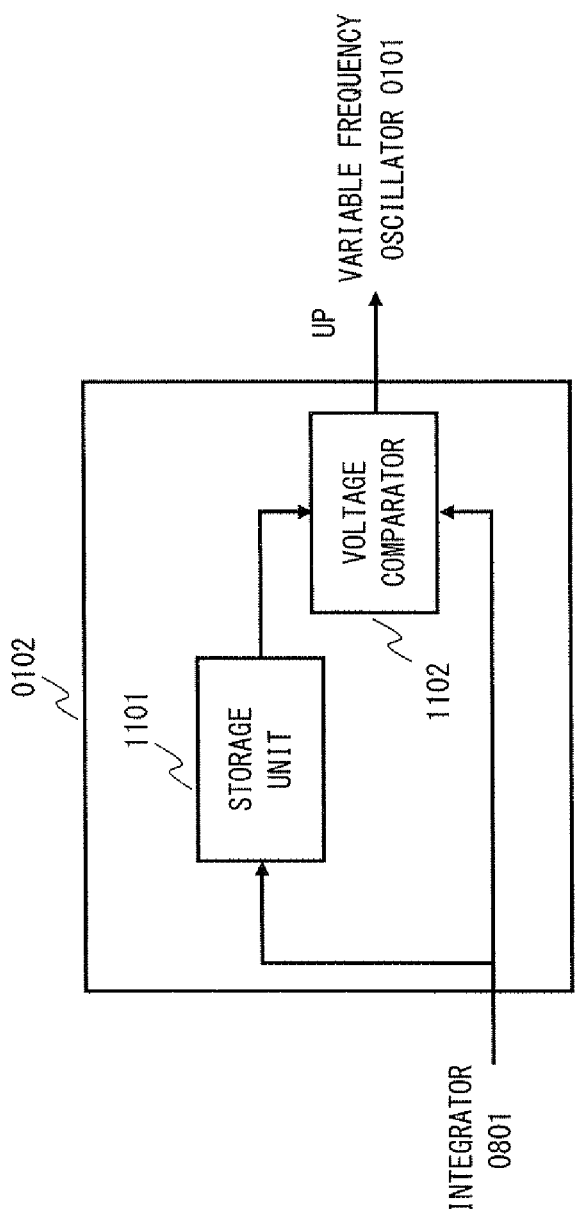
FIG. 11 is a configuration diagram according to the third exemplary embodiment in which the first controller is an analog controller.

Next, a circuit example of the first controller 0102 in the case where the first controller 0102 is an analog controller is explained with reference to FIG. 11. The first controller 0102 includes a storage unit 1101 and a voltage comparator 1102. The storage unit 1101 is composed of a switch element and a capacitance.

The voltage comparator 1102 compares the control value X output from the integrator 0801 with the control value X2 stored in the storage unit 1101. The control value X2 is a control value corresponding to the frequency f2 indicating the upper limit value for the frequency sweeping range. The voltage comparator 1102 gradually raises the oscillating frequency by setting the control value (UP) at a high level as long as a relation "X<X2" is satisfied, and can stop the sweeping by setting the control value (UP) at a low level at the moment when a relation "X>X2" is satisfied. Note that after the control value X exceeds the value X2 in the voltage comparator 1102, the sweeping may be maintained in the stopped state. Alternatively, the control value (DN) may be supplied until the control value X becomes smaller than the value X1 and the sweeping is thereby performed again. In that case, another set of a storage unit and a voltage comparator may be used to compare the control value X with the value X1.

Note that the frequency characteristic of the integrator 0801 is important for making the feedback loop of the second controller 0501 operate with stability without causing any oscillation, and may have a filter characteristic having a non-direct-current pole and/or a zero point.

Further, when the variable frequency oscillator 0101 is controlled by the first controller 0102, the operation is performed as an opened loop. Therefore, the oscillation problem does not occur. Therefore, it is desirable to change the frequency characteristic of the integrator 0801 depending on whether the variable frequency oscillator 0101 is controlled by using the first controller 0102 or the second controller 0501.

Further, in order to make a linear approximation of the relation between the control value X and the variable frequency with satisfactory accuracy, there is a possibility that the sweeping frequency range may need to be narrowed. In such cases, it is preferable to cope with such situations by dividing the necessary sweeping frequency range into a plurality of sections, to thereby improve both the sweeping speed and the sweeping accuracy.

Fourth Exemplary Embodiment

Figure 12:
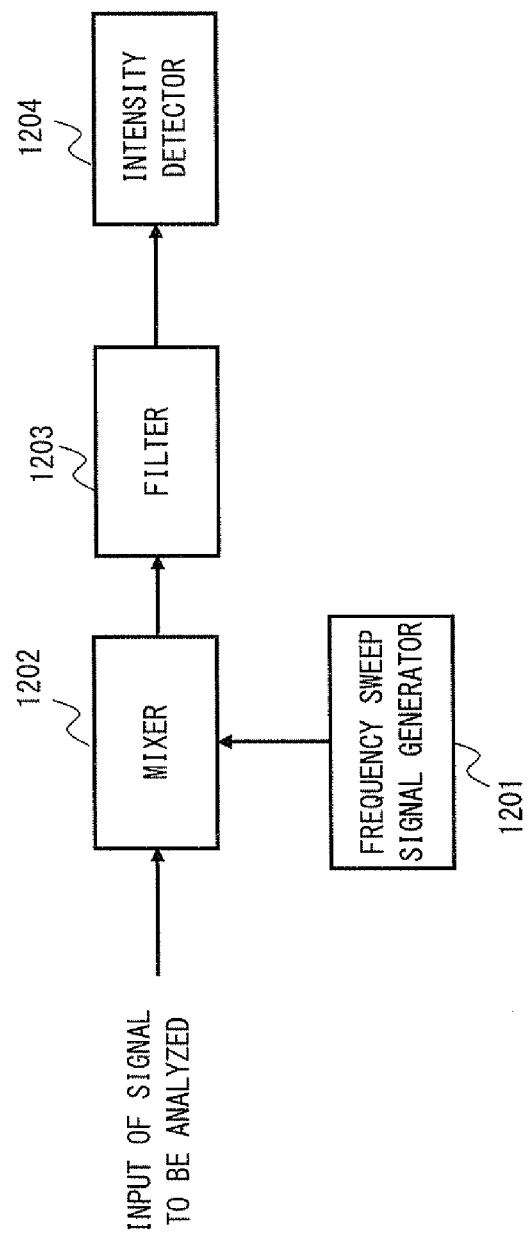
FIG. 12 is a configuration diagram of a frequency component analysis apparatus according to a fourth exemplary embodiment.

Next, a configuration example of a frequency component analysis apparatus according to a fourth exemplary embodiment of the present invention is explained with reference to FIG. 12. The frequency component analysis apparatus according to the fourth exemplary embodiment includes a frequency sweep signal generator 1201 according to one of the first to third exemplary embodiments, a mixer 1202, a filter 1203, and an intensity detector 1204.

The mixer 1202 mixes the oscillating frequency output from the frequency sweep signal generator 1201 with a signal to be analyzed, which is the subject to be analyzed, and extracts a signal having a desired frequency. The mixer 1202 outputs the extracted signal to the filter 1203.

The filter 1203 desirably includes a variable element, and it is desirable that the time constant of the necessary frequency range be changeable according to the accuracy. Further, the time constant of the integrator 0801 is desirably changed according to the time constant of the filter 1203. This is because if the time constant of the filter 1203 is excessively large, the local oscillating frequency could change before the detection of the intensity of the signal component that has passed the band of the filter 1203 is completed. On the other hand, if the time constant of the integrator 0801 is excessively large, the frequency sweeping takes an unnecessarily long time.

The intensity detector 1204 detects the intensity of the signal output from the filter 1203. For example, when the intensity detected by the intensity detector 1204 is lower than a predetermined threshold, the swept frequency can be determined to be a white space. Alternatively, it is possible to determine whether the swept frequency is a white space or not with higher accuracy by using other means having a higher sensitivity. In general, means having a higher sensitivity requires a longer detection time. Therefore, by combining such means with this exemplary embodiment, it is possible to find a white space in a shorter time. Further, when the intensity detected by the intensity detector 1204 is higher than the predetermined threshold, it can be determined that the swept frequency is not a white space.

Fifth Exemplary Embodiment

Figure 13:
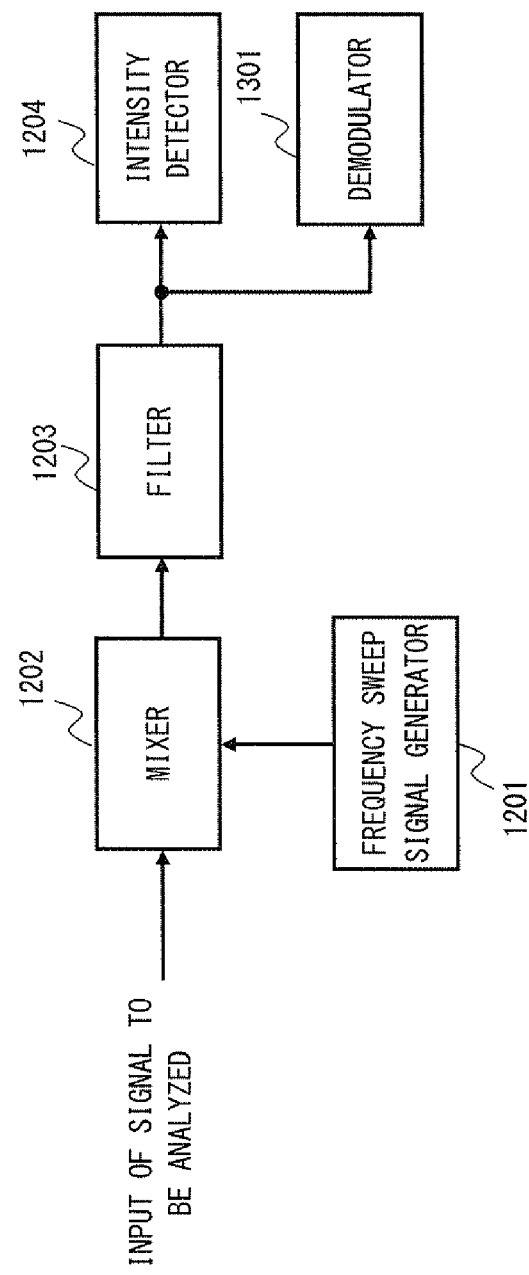
FIG. 13 is a configuration diagram of a radio apparatus according to a fifth exemplary embodiment.

Next, a configuration example of a radio apparatus according to a fifth exemplary embodiment of the present invention is explained with reference to FIG. 13. The radio apparatus according to the fifth exemplary embodiment includes a demodulator 1301 in addition to the components of the frequency component analysis apparatus according to the fourth exemplary embodiment. As a result, the radio apparatus can perform a frequency component analysis at a high speed, find an unused frequency band, and use the found frequency band. Further, it is possible to provide a compact radio apparatus having low power consumption by using a frequency sweep signal generator according to one of the first to third exemplary embodiments. It should be noted that when radio communication is performed, the phase noise of the local oscillation signal becomes an important parameter for determining the signal-to-noise ratio. Therefore, it is desirable to generate a local oscillation signal having a low phase noise by using a phase-locked loop formed by the second controller when radio communication is performed.

Note that the present invention is not limited to the above-described exemplary embodiments, and various modifications can be made as appropriate without departing from the spirit of the present invention.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention.

This application is based upon and claims the benefit of priority from Japanese patent application No. 2011-181625, filed on Aug. 23, 2011, the disclosure of which is incorporated herein in its entirety by reference.

REFERENCE SIGNS LIST

0101 VARIABLE FREQUENCY OSCILLATOR
0102 FIRST CONTROLLER
0201 VARACTOR SECTION
0202 COIL SECTION
0203 TRANSISTOR SECTION
0401 STORAGE UNIT
0402 CONTROL VALUE GENERATION UNIT
0501 SECOND CONTROLLER
0502 SELECTOR
0601 REFERENCE SIGNAL SOURCE
0602 FREQUENCY DIVIDER
0603 PHASE FREQUENCY COMPARATOR
0701 DELAY STAGE
0702 DFF
0703 ENCODER
0801 INTEGRATOR
0901 ADDER
0902 LATCH
1003 DFF
1004 DFF
1005 AND GATE

1101 STORAGE UNIT
1102 VOLTAGE COMPARATOR

The invention claimed is:

1. A frequency sweep signal generator comprising:
a variable frequency oscillator that changes an oscillating frequency according to a change of an input control value;
a first controller that generates a first control value so that the oscillating frequency within a predetermined frequency sweeping range is output;
a second controller that outputs a second control value according to a difference between a phase of the oscillating frequency and a phase of a reference signal;
a selector that selects one of the first and second control values; and
an integrator that changes a time constant according to schedule information specifying a schedule, integrates the selected control value, and outputs the integrated selected control value to the variable frequency oscillator, the selected control value being changed according to the schedule,
wherein the first or second controller controls an increment of the first or second control value to be output to the variable frequency oscillator per unit time so that, when a change of the oscillating frequency with respect to the increment of the first or second control value is non-linear, the oscillating frequency is changed linearly with respect to a passage of time.

2. The frequency sweep signal generator according to claim 1, further comprising a storage unit that stores the schedule information specifying the schedule, the first control value being changed according to the schedule.

3. The frequency sweep signal generator according to claim 2, wherein the integrator integrates the control value selected in the selector and outputs the integrated control value to the variable frequency oscillator.

4. The frequency sweep signal generator according to claim 3, wherein
the storage unit stores the first control value corresponding to an upper limit oscillating frequency in the frequency sweeping range, and
the frequency sweep signal generator further comprises a comparison circuit that compares the control value output from the integrator with the first control value stored in the storage unit.

5. A frequency component analysis apparatus comprising:
a frequency sweep signal generator according to claim 3;
a mixer that mixes a signal generated in the frequency sweep signal generator with a signal to be analyzed and extracts a signal having a desired frequency, the signal to be analyzed being a subject to be analyzed; and
an intensity detector that detects an intensity of the signal extracted by the mixer.

6. The frequency sweep signal generator according to claim 2, wherein
the storage unit stores the first control value corresponding to an upper limit oscillating frequency in the frequency sweeping range, and
the frequency sweep signal generator further comprises a comparison circuit that compares the control value output from the integrator with the first control value stored in the storage unit.

7. A frequency component analysis apparatus comprising:
a frequency sweep signal generator according to claim 6;
a mixer that mixes a signal generated in the frequency sweep signal generator with a signal to be analyzed and extracts a signal having a desired frequency, the signal to be analyzed being a subject to be analyzed; and
an intensity detector that detects an intensity of the signal extracted by the mixer.

8. A frequency component analysis apparatus comprising:
a frequency sweep signal generator according to claim 2;
a mixer that mixes a signal generated in the frequency sweep signal generator with a signal to be analyzed and extracts a signal having a desired frequency, the signal to be analyzed being a subject to be analyzed; and
an intensity detector that detects an intensity of the signal extracted by the mixer.

9. A frequency component analysis apparatus comprising:
a frequency sweep signal generator according to claim 1;
a mixer that mixes a signal generated in the frequency sweep signal generator with a signal to be analyzed and extracts a signal having a desired frequency, the signal to be analyzed being a subject to be analyzed; and
an intensity detector that detects an intensity of the signal extracted by the mixer.

10. The frequency sweep signal generator according to claim 1, wherein the integrator functions as an n-bit accumulator and comprises:
an adder which is supplied with a clock frequency and a frequency setting control value; and
a latch which is supplied with the clock frequency and an output of the adder, and outputs the integrated selected control.

11. The frequency sweep signal generator according to claim 1, wherein if the selected control value comprises the first control value, then the integrator increases the selected control value at a fixed rate and stops increasing the selected control value when the integrated selected control value reaches a final value for the predetermined frequency sweeping range.

12. The frequency sweep signal generator according to claim 1, wherein if the selected control value comprises the second control value, then the integrator is used as a loop filter for stabilizing a feedback loop and suppressing unnecessary spurious signals.

13. A frequency sweep signal generating method in a variable frequency oscillator that changes an oscillating frequency according to a change of an input control value, the frequency sweep signal generating method comprising:
generating a first control value so that the oscillating frequency within a predetermined frequency sweeping range is output;
outputting a second control value according to a difference between a phase of the oscillating frequency and a phase of a reference signal;
selecting one of the first and second control values; and
changing a time constant according to schedule information specifying a schedule, integrating the selected control value, and outputting the integrated selected control value to the variable frequency oscillator, the selected control value being changed according to the schedule,
wherein an increment of the first or second control value to be output to the variable frequency oscillator per unit time is controlled so that, when a change of the oscillating frequency with respect to the increment of the first or second control value is non-linear, the oscillating frequency is changed linearly with respect to a passage of time.

* * * * *